United States Patent
Godzaridis et al.

(10) Patent No.: US 11,164,392 B2
(45) Date of Patent: Nov. 2, 2021

(54) INFRASTRUCTURE DESIGN USING 3D REALITY DATA

(71) Applicant: Bentley Systems, Incorporated, Exton, PA (US)

(72) Inventors: Elenie Godzaridis, Quebec (CA); Mathieu St-Pierre, Ste-Brigitte de Laval (CA)

(73) Assignee: Bentley Systems, Incorporated, Exton, PA (US)

( * ) Notice: Subject to any disclaimer, the term of this patent is extended or adjusted under 35 U.S.C. 154(b) by 71 days.

(21) Appl. No.: 15/699,266

(22) Filed: Sep. 8, 2017

(65) Prior Publication Data

US 2019/0080520 A1     Mar. 14, 2019

(51) Int. Cl.
*G06T 17/00*     (2006.01)
*G06T 19/20*     (2011.01)
(Continued)

(52) U.S. Cl.
CPC .............. *G06T 19/20* (2013.01); *G06F 30/13* (2020.01); *G06F 30/20* (2020.01); *G06T 15/04* (2013.01);
(Continued)

(58) Field of Classification Search
CPC ..... G06T 15/005; G06T 17/05; G06T 19/006; G06T 2207/10028; G06T 2207/10032;
(Continued)

(56) References Cited

U.S. PATENT DOCUMENTS

| | | | |
|---|---|---|---|
| 2011/0225208 A1* | 9/2011 | Boersma ................. | G06T 17/05 707/803 |
| 2014/0152664 A1* | 6/2014 | Le Meur .................. | G06T 3/40 345/428 |

(Continued)

FOREIGN PATENT DOCUMENTS

WO     WO-2011/085434 A1     7/2011

OTHER PUBLICATIONS

TerraBuilder PhotoMesh and CityBuilder Quick Guide, retrieved from http://www.skylineglobe.com/SkylineGlobe/Corporate/PDF/TerraBuilder_PhotoMesh_and_CityBuilder_Quick_Guide.pdf (Year: 2014).*

(Continued)

*Primary Examiner* — Weiming He
(74) *Attorney, Agent, or Firm* — Cesari and McKenna, LLP; James A. Blanchette

(57) ABSTRACT

In an example embodiment, a design application receives in its graphical user interface (GUI) user input specifying a boundary of a design region of a 3-D reality model of a site. A ground detection process detects a plurality of ground points within the design region that represent ground. A terrain creation process generates a 2.5D terrain mesh for the design region. A clipping process clips around the design region to show the 2.5D terrain mesh within the design region. A CAD modeling process is then used to place one or more 3-D CAD objects that represent planned infrastructure upon the 2.5D terrain mesh within the design region. The design application displays in the GUI the created combined view including the 3-D CAD objects placed upon the 2.5D terrain mesh within the design region, surrounded by a remaining part of the 3-D reality model that provides context.

20 Claims, 17 Drawing Sheets

(51) Int. Cl.

| | |
|---|---|
| *G06F 30/13* | (2020.01) |
| *G06F 30/20* | (2020.01) |
| *G06T 15/04* | (2011.01) |
| *G06T 15/30* | (2011.01) |
| *G06T 17/05* | (2011.01) |
| *G06T 17/20* | (2006.01) |
| *G06T 7/11* | (2017.01) |
| *G06F 3/0484* | (2013.01) |
| *G06K 9/00* | (2006.01) |

(52) U.S. Cl.
CPC .............. *G06T 15/30* (2013.01); *G06T 17/05* (2013.01); *G06T 17/20* (2013.01); *G06F 3/04845* (2013.01); *G06K 9/0063* (2013.01); *G06T 7/11* (2017.01); *G06T 2200/24* (2013.01); *G06T 2207/20104* (2013.01); *G06T 2207/30184* (2013.01); *G06T 2210/36* (2013.01)

(58) Field of Classification Search
CPC ........... G06T 17/00; G06T 7/74; G06T 15/04; G06T 2200/04; G06T 2200/08; G06T 17/205; G06T 17/30; G06T 2200/24; G06T 2210/36; G06T 7/11
See application file for complete search history.

(56) References Cited

U.S. PATENT DOCUMENTS

| | | | |
|---|---|---|---|
| 2015/0081252 A1* | 3/2015 | Loss | G06F 17/5004 703/1 |
| 2017/0090460 A1* | 3/2017 | Andrew | B33Y 50/02 |
| 2017/0243404 A1 | 8/2017 | Morales et al. | |
| 2018/0039848 A1* | 2/2018 | Konolige | G06T 7/75 |

OTHER PUBLICATIONS

Skyline PhotoMesh v6.6 Introduction, published on Jul. 19, 2015, retrieved from https://www.youtube.com/watch?v=VM52rfAls2E on Jan. 10, 2019 (Year: 2015).*

Skyline TerraExplorer 6.5 Feature Demo, published on Oct. 29, 2013, retrieved from https://www.youtube.com/watch?v=BW9anTnuiPM on Jan. 10, 2019 (Year: 2013).*

Dean M Howell, Application of Mobile LiDAR on Pothole detection, Oct. 23, 2013, retrieved from http://geoawesomeness.com/application-of-mobile-lidar-on-pothole-detection/on Jan. 11, 2019. (Year: 2013).*

TerraBuilder (versoin 6.6.1) Datasheet (Year: 2015).*

Skyline TerraExplorer 6.1—Measurement and Analysis Tools, https://www.youtube.com/watch?v=DjmFtPsqkME, published on Feb. 15, 2012 (Year: 2012).*

Axelsson, Peter, "DEM Generation From Laser Scanner Data Using Adaptive Tin Models," International Archives of Photogrammetry and Remote Sensing, vol. XXXIII, Part B4, Amsterdam, Jan. 2000, pp. 110-117.

"Autodesk® InfraWorks Training Guide: Finding and Importing Data for Your Model," Autodesk, Inc., Jun. 18, 2013, pp. 1-71.

"3DReshaper Version 2016MR1—Beginner's Guide," The 3D Scanner Software, Hexagon, Technodigit, Oct. 2016, pp. 1-86.

U.S. Appl. No. 15/232,446, filed Aug. 6, 2016 by Elenie Godzaridis et al. for Multi-Resolution Tiled 2.5D Delaunay Triangulation Stitching, pp. 1-40.

U.S. Appl. No. 15/293,105, filed Oct. 13, 2016 by Elenie Godzaridis et al. for Hybrid Mesh From 2.5D and 3D Point Data, pp. 1-26.

U.S. Appl. No. 15/669,593, filed Aug. 4, 2017 by Elenie Godzaridis et al. for Non-Destructive Multi-Resolution Surface Clipping, pp. 1-34.

Day, Martyn, et al., "The Age of the Reality Mesh," AEC Magazine, vol. 87, Dec. 2016, pp. 12-15.

"Notification of Transmittal of the International Search Report and the Written Opinion of the International Searching Authority, or the Declaration," International Filing Date: May 31, 2018, International Application No. PCT/US2018/035387, Applicant: Bentley Systems, Incorporated, dated Aug. 30, 2018, pp. 1-14.

* cited by examiner

INFRASTRUCTURE DESIGN USING 3D REALITY DATA

BACKGROUND

Technical Field

The present disclosure relates generally to computer-aided design, and more specifically to techniques that enable infrastructure design using three dimensional (3-D) reality data.

Background Information

A highly-detailed 3-D model of existing conditions at a site (also referred to as a "3-D reality model") may be produced from photographs of the site taken with a camera, LiDAR, and/or additional data sources, for example, by an automated software process that utilizes automatic triangulation, 3-D reconstruction, texture mapping, and other techniques. Such a 3-D reality model may have many uses in an infrastructure design or geographic information system (GIS) workflow.

One use is to provide real-world context for project design decisions. While using a 3-D reality model to present a user an accurate visualization of reality is typically helpful, it may be even more helpful to allow a user to modify the reality to see the effects of new constructs, using the 3-D reality model to provide lush context. This may entail combining the 3-D reality model with computer aided design (CAD) objects that represent planned infrastructure (i.e. roads, bridges, pipelines, buildings, equipment, or other man-made structures). For example, a user may desire to plan the path of a roadway through a neighborhood, to see how the planned roadway interacts with the terrain, buildings, vegetation and other existing features in the neighborhood. To this end, it may be desirable to combine a 3-D reality model of the neighborhood with CAD objects that represent the planned roadway. To provide an efficient workflow, it may be helpful to permit the user to dynamically edit the CAD objects within the lush context provided by the 3-D reality model.

However combining CAD objects with a 3-D reality model introduces a number of challenges. It may be difficult to target the ground of a 3-D reality model for placement of the CAD objects, where the 3-D reality model also models existing 3-D objects (e.g., existing buildings, equipment, or other man-made structures) and natural 3-D objects (e.g., trees, bushes, etc.). Likewise it may be difficult to mask a 3-D reality model where CAD objects are to be placed. Further, it may be difficult to blend the target ground and the added CAD objects with the rest of the 3-D reality model to produce a seamless display. Still further, it may be difficult to allow for iterative changes and edits to the CAD objects added to the 3-D reality model, to allow for iterative design of the planned infrastructure with the same 3-D reality model. These challenges create burdens in terms of both resource utilization and user interface usability. For example, some of these challenges, and prior attempts to address them, introduce high processor and memory demands on electronic devices, hindering operation. Likewise, some of these challenges hinder generation of an effective user interface for design tasks, hindering infrastructure design or GIS workflow.

Given these and other challenges, there is a need for improved techniques that enable infrastructure design using 3-D reality data.

SUMMARY

Techniques are provided for reducing a design region of a 3-D reality model of a site into a two-and-a-half dimension (2.5D) terrain mesh so that it can be efficiently combined with CAD objects that represent planned infrastructure. The design region reduced to the 2.5D terrain mesh may be rendered continuous with the rest of the 3-D reality model, which provides larger context for the planned infrastructure. In such manner, an efficient workflow may be enabled for infrastructure design using three dimensional 3-D reality data.

In one specific embodiment, a design application executing on an electronic device receives in its graphical user interface (GUI) user input specifying a boundary of a design region of a 3-D reality model of a site. A ground detection process detects a plurality of ground points within the design region that represent ground. Based at least on the user-specific boundary of the design region and the detected ground points, a terrain creation process generates a 2.5D terrain mesh for the design region. A clipping process clips around the design region to show the 2.5D terrain mesh within the design region. A CAD modeling process is then used to place one or more 3-D CAD objects that represent planned infrastructure upon the 2.5D terrain mesh within the design region. The design application displays in the GUI the created combined view, including the 3-D CAD objects placed upon the 2.5D terrain mesh within the design region, surrounded by a remaining part of the 3-D reality model that provides context.

It should be understood that a variety of additional features and alternative embodiments may be implemented other than those discussed in this Summary. This Summary is intended simply as a brief introduction to the reader for the further description that follows, and does not indicate or imply that the examples mentioned herein cover all aspects of the disclosure, or are necessary or essential aspects of the disclosure.

BRIEF DESCRIPTION OF THE DRAWINGS

The description refers to the accompanying drawings of example embodiments, of which.

DETAILED DESCRIPTION

Figure 1:
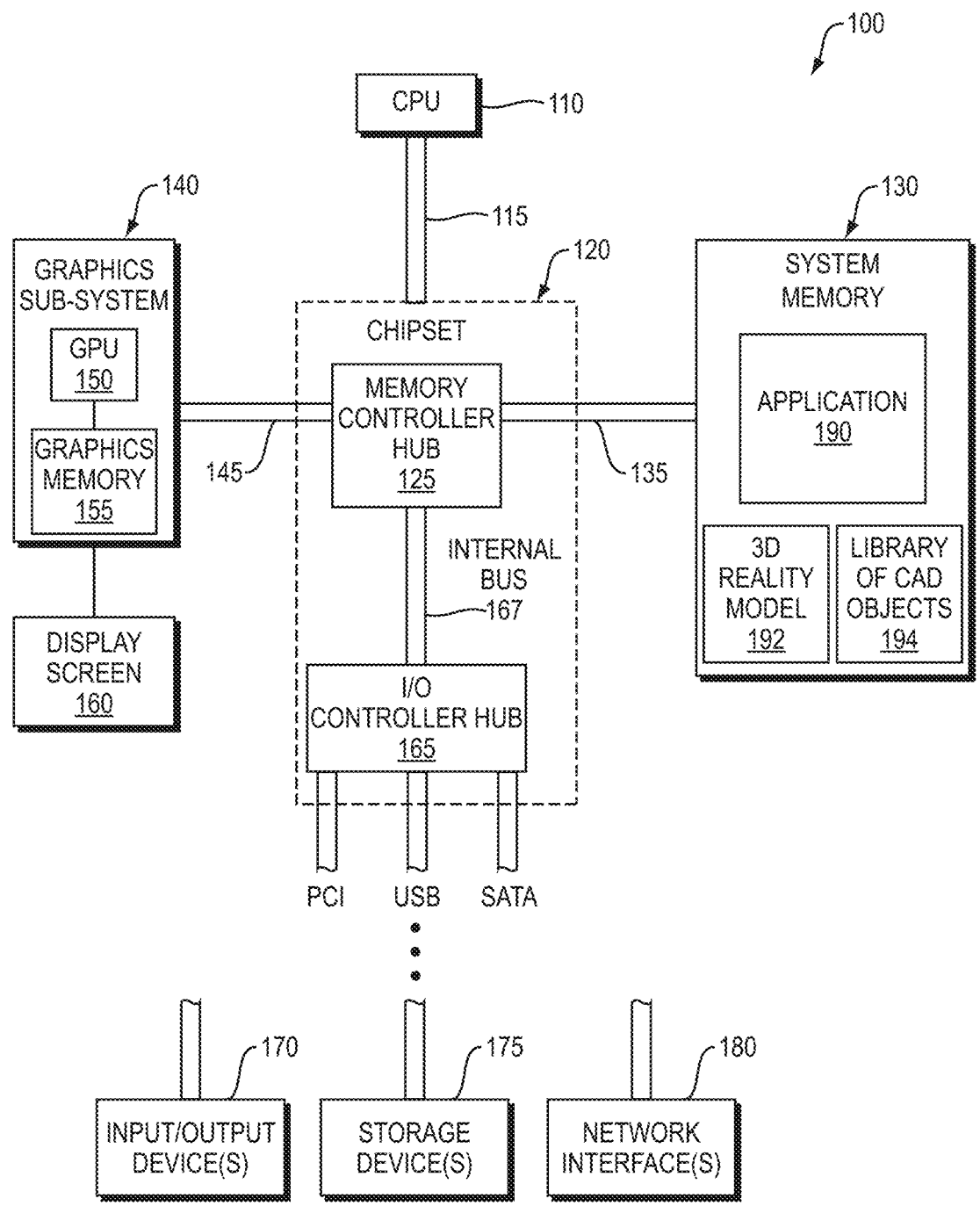
FIG. 1 is a block diagram of an example electronic device (e.g., a computer) that may be used with the present techniques.

FIG. 1 is a block diagram of an example electronic device 100 (e.g., a computer) that may be used with the present techniques. The electronic device includes a central processing unit (CPU) 110 that may be coupled to a chipset 120 by a front side bus 115. The chipset 120 includes a memory controller hub 125 that is responsible for communications with high-speed devices such as system memory 130 and a graphics subsystem (e.g., a graphics card) 140. The memory controller hub 125 is coupled to the system memory 130 by a high-speed memory bus 135. The system memory 130 is typically volatile memory, such as a Random Access Memory (RAM), which is adapted to store a wide range of software and data being actively used by the CPU 110. The memory controller hub 125 is coupled to a graphics subsystem 140 (e.g., a graphics card) by a high-speed graphics bus 145. The graphics subsystem 140 includes a GPU 150 and graphics memory 155, among other components. The graphics subsystem 140 is coupled to at least one display screen 160.

The chipset 120 further includes an input/output controller hub 165 coupled to the memory controller hub by an internal bus 167. Among other functions, the input/output controller hub 165 may support a variety of types of peripheral buses, such as a peripheral component interconnect (PCI) bus, a universal serial bus (USB) bus, and/or a Serial Advanced Technology Attachment (SATA) bus, for connecting to other system components. The system components may include one or more I/O devices 170, such as a keyboard, a mouse, a removable media drive, etc., one or more persistent storage devices 175, such as a hard disk drive, a solid-state drive, or another type of persistent data store, one or more network interfaces 180, such as an Ethernet interface or a Wi-Fi adaptor, among other system components. The network interface(s) 180 may allow communication with other electronic devices over a computer network, such as the Internet, to enable various types of collaborative, distributed, or remote computing.

Working together, the components of the electronic device 100 (and other electronic devices in the case of collaborative, distributed, or remote computing) may execute a number of different types of software that utilize various sources of data (e.g., files) persistently stored in storage devices 175 and loaded into memory 130 when needed. For example, the data sources may include a 3-D reality model 192 of existing conditions at a site, and library of CAD objects 194 that represent individual units of planned infrastructure. Likewise, the software may include a design application 190 that may include a number of software processes, including a design region definition process, a ground detection process, a texture extraction process, a terrain creation process, a clipping process, and a CAD modeling process, among others, for enabling infrastructure design using 3-D reality data.

Figure 2:
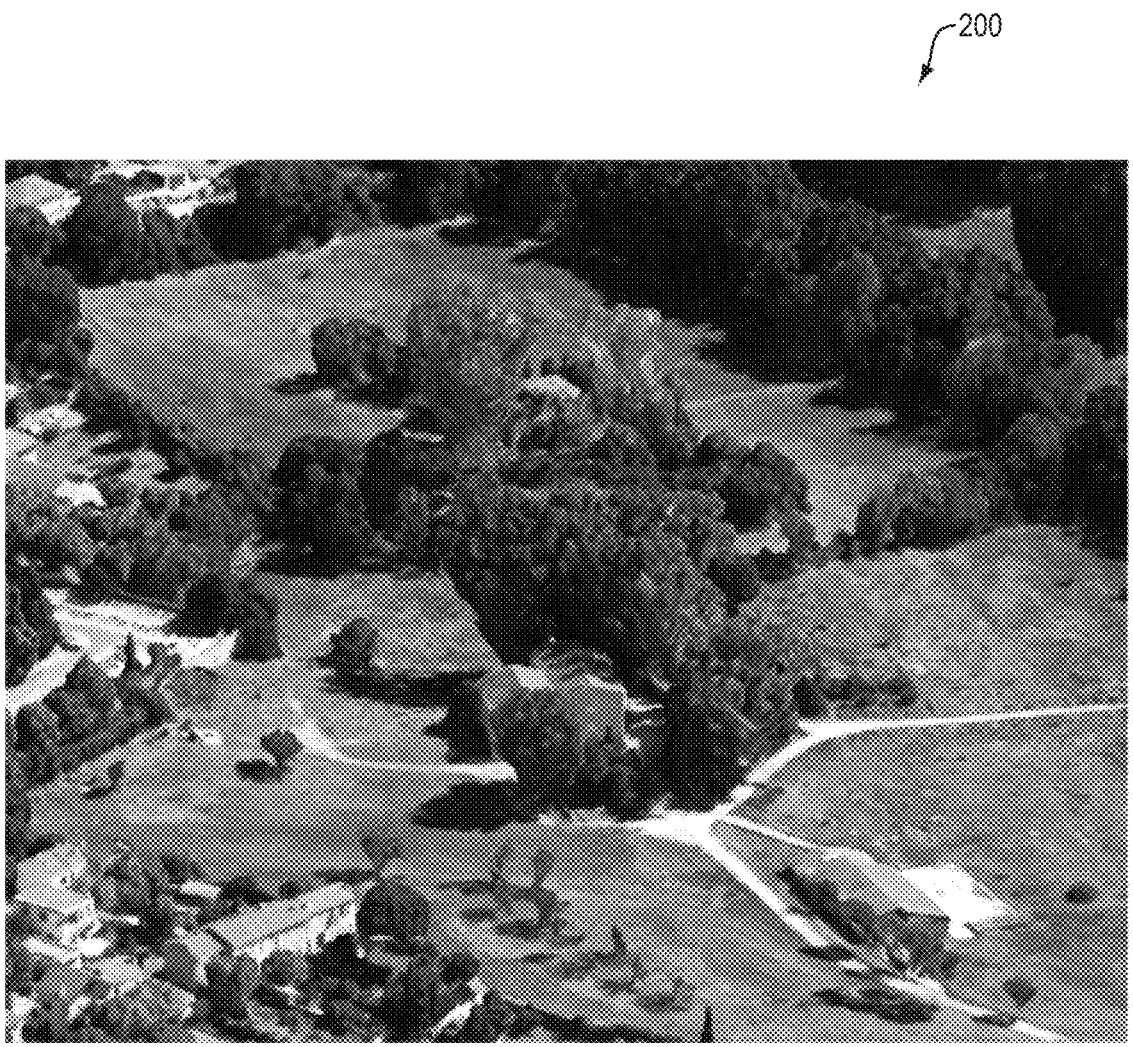
FIG. 2 is a view of an example 3-D reality model that may be displayed to a user in a GUI of a design application.

FIG. 2 is a view 200 of an example 3-D reality model that may be displayed to a user in a GUI of the design application 190. While the example shows a neighborhood, it should be understood that the 3-D reality model may represent a wide variety of existing conditions at a site. The view 200 may show representations of terrain (i.e. features substantially at ground level, including various ground types such as fields, roads, parking lots, etc.) and areas that show representations of non-terrain features (i.e. features that are not substantially at ground level, including man-made 3-D structures (such as buildings) and natural 3-D structures (such as trees).

Figure 3:
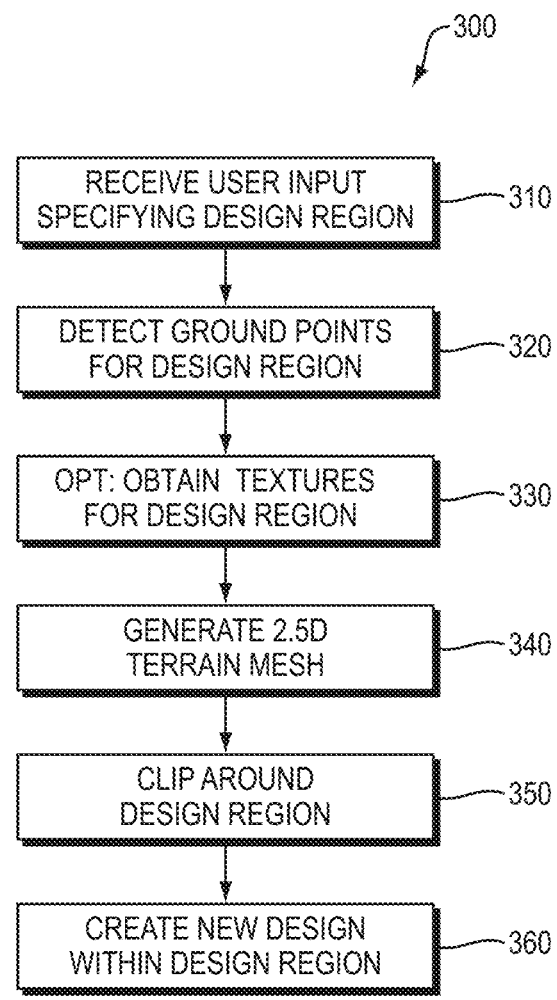
FIG. 3 is a high-level flow diagram of a sequence of steps that may be executed by software processes of a design application.
Figure 4:
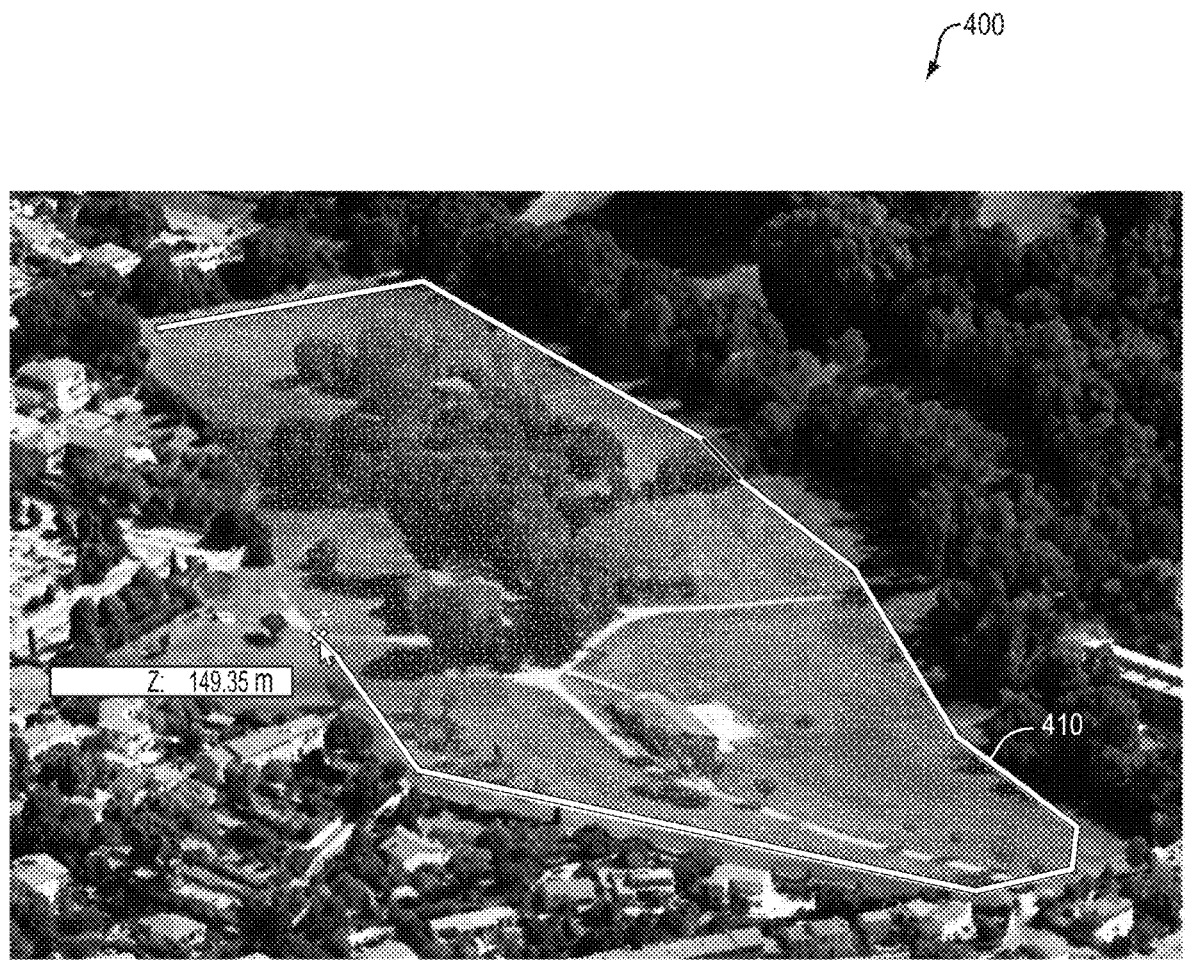
FIG. 4 is a view of an example 3-D reality model that may be displayed in the GUI of the design application, showing a partially drawn polygon, which, when completed, will define a design region.

FIG. 3 is a high-level flow diagram of a sequence of steps 300 that may be executed by software processes of the design application 190. At step 310, a design region definition process of the design application 190 receives user input specifying a boundary of a design region of the 3-D reality model 200 in which the user intends to add one or more CAD objects. The user input may take the form of a polygon drawn on a view of the 3-D reality model shown in the GUI. In some implementations, the user input may specify portions of the boundary (e.g., segments of the polygon) that extend over representations of terrain (i.e. terrain data), and portions of the boundary (e.g., segments of the polygon) that extend over non-terrain features (i.e. non-terrain data), as discussed in more detail below. FIG. 4 is a view 400 of an example 3-D reality model that may be displayed in the GUI of the design application 190, showing a partially drawn polygon, which when completed will define a design region 410. Portions of the polygon designated by the user as extending over terrain data are shown in a first manner (e.g., color, line type, etc.) and portions that extend over non-terrain data are shown in a second, different manner (e.g., in a different color, line type, etc.).

Figure 5:
FIG. 5 is a view of an example 3-D reality model that may be displayed in the GUI of the design application, showing a preview of partial results of a ground detection process.

At step 320, a ground detection process of the design application 190 detects ground points for the design region. In some implementations, the ground detection process may utilize an iterative ground detection algorithm that assembles a final result over multiple cycles of a processing loop. A preview of partial results may be shown to the user within the GUI while the ground detection process is executing. The preview may, in some implementations, permit a user to early terminate the ground detection process (by making a selection in the GUI), if the partial results appear sufficient or if they reveal a problem that may require a change of parameters used by the ground detection algorithm and a restart of the ground detection process. FIG. 5 is a view 500 of an example 3-D reality model that may be displayed in the GUI of the design application 190, showing a preview of partial results of the ground detection process. Detected ground at this step may be indicated by an opaque mesh of a uniform predetermined color, or with other visual indication.

At optional step 330, textures are obtained for the design region by a software process of the design application. In one implementation, a texture extraction process of the design application extracts textures for the design region from the 3-D reality model. The texture extraction process may create a series of texture bitmaps for grid cells of the design region, as explained in more detail below. Alternatively, textures may be obtained from another data source, for example road map data external to the original 3-D reality model.

Figure 6:
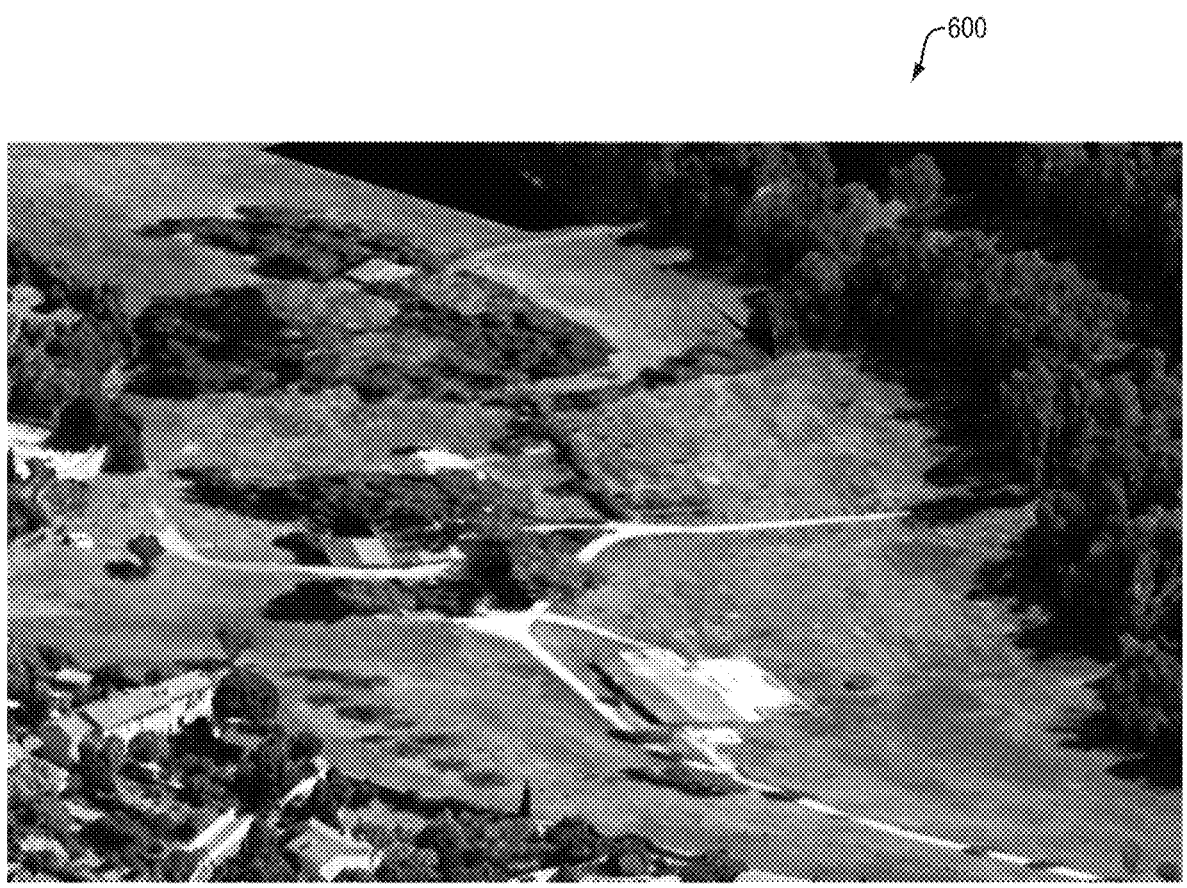
FIG. 6 is a view of an example 3-D reality model that may be displayed in the GUI of the design application, showing a resulting 2.5D terrain mesh in a design region surrounded by a 3-D reality model.

At step 340, based on the user-specific boundary of the design region, the detected ground points from step 320, and the texture data from step 330 (if available), a terrain creation process of the design application 190 generates a 2.5D terrain mesh (e.g., a 2.5D multi-resolution terrain mesh having a plurality of levels of detail (LOD)) for the design region. At step 350, a clipping process of the design application 190 clips around the design region. The clipping may involve applying a clip boundary to the 2.5D terrain mesh and applying a clip mask to the 3-D reality model. As a result, the 2.5D terrain mesh is rendered visible in the design region, surrounded by the 3-D reality model beyond the design region. In some implementations, the clipping process may be a non-destructive surface mesh clipping software process, as described in U.S. patent application Ser. No. 15/669,593, titled "Non-Destructive Multi-Resolution Surface Clipping", filed Aug. 4, 2017, the contents of which are incorporated by reference herein. FIG. 6 is a view 600 of an example 3-D reality model that may be displayed in the GUI of the design application 190, showing a resulting 2.5D terrain mesh in the design region surrounded by the 3-D reality model. As can be seen, non-terrain features, including man-made 3-D structures, such as buildings, and natural 3-D structures, such as trees, now appear flattened in the design region. However, outside the design region, non-terrain features retain their original 3-D appearance.

At step 360, in response to user input in the GUI, a CAD modeling process of the design application 190 is used to add CAD objects for planned infrastructure from the library of CAD objects 194 to the 2.5D terrain mesh within the design to define a new design. The CAD objects may be placed on the "base" defined by the 2.5D terrain mesh within the design region. Outside the design region, context is provided by the original 3-D reality model.

Figure 7:
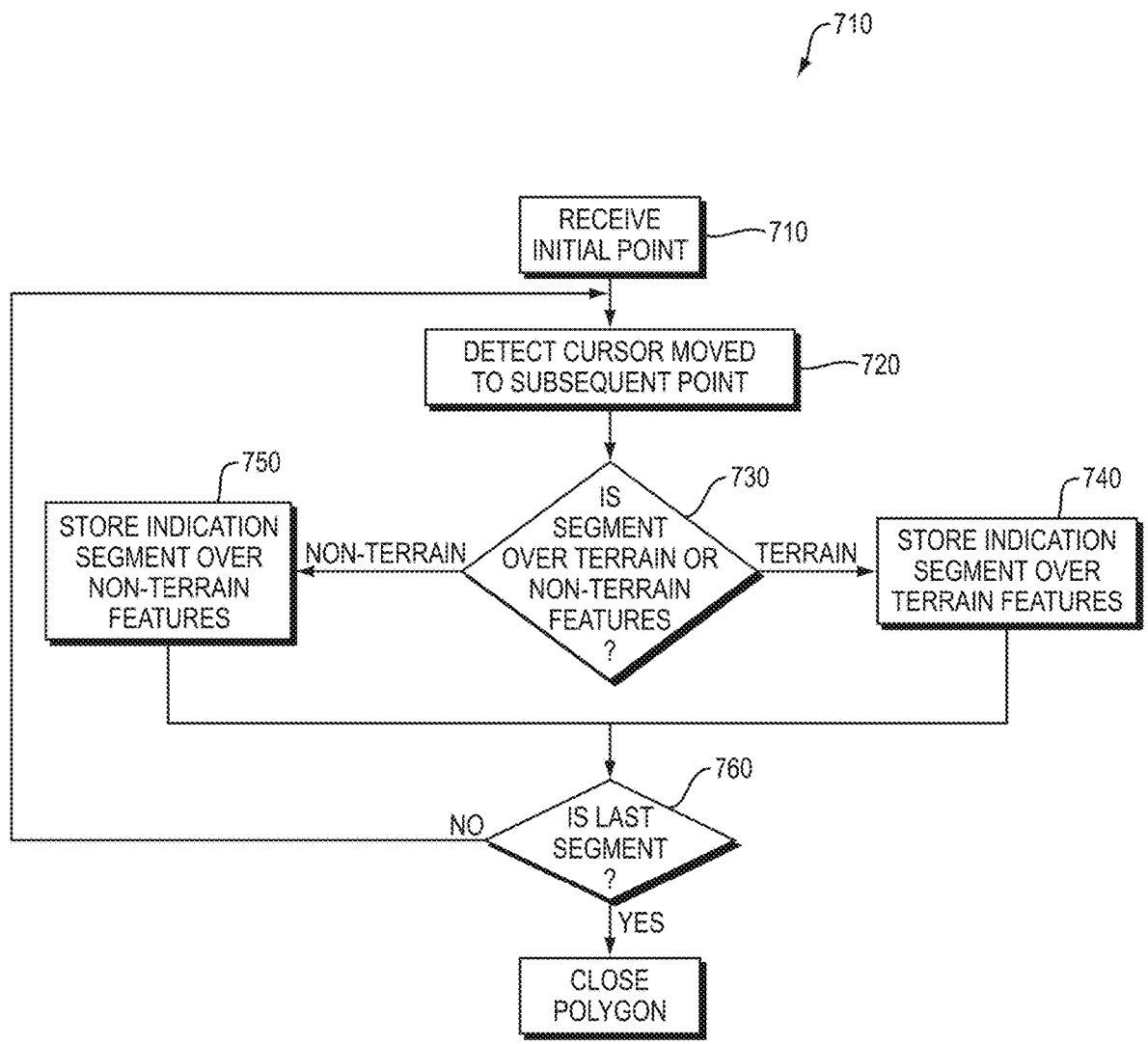
FIG. 7 is a flow diagram of an example expanded sequence of steps that may be implemented as part of FIG. 3 by a design region definition process to specify a boundary of a design region.

Looking to the steps 300 of FIG. 3 in more detail, FIG. 7 is a flow diagram of an example expanded sequence of steps 700 that may be implemented as part of step 310 of FIG. 3 by the design region definition process to specify a boundary of a design region. At step 710, the design region definition process detects that a user has moved a cursor over and selected (e.g., clicked on) an initial point used to define a polygon that defines the boundary of the design region. At step 720, the design region definition process detects that a user has moved the cursor over a subsequent point, that together with the initial point define a segment of the polygon. The user may determine whether the segment of the polygon connecting the two points extends over terrain features or non-terrain features. At step 730, the design region definition process receives user input indicating whether the segment extends over terrain features or non-terrain feature. In some implementations, it may be assumed that, by default, all segments extend over terrain features and the input indicating the segment extends over terrain features may be a simple click. Input indicating the terrain extends over non-terrain features may be a click in combination with the press of a designated keyboard key. It should be understood, however, that the input may take a number of other different forms.

If the user has indicated that the segment extends over terrain features, execution proceeds to step 740, where such indication is stored. Likewise, if the user has indicated the segment extends over non-terrain features, execution proceeds to step 750, where such indication is stored. At step 760, the design region definition process determines whether the segment is the last one of the polygon that defines the boundary of the design region. If not, execution loops to step 720, where the design region definition process waits for the user to move the cursor over another point. If not, execution proceeds to step 770, where the design region definition process closes the polygon that defines the design region and process terminates.

Figure 8:
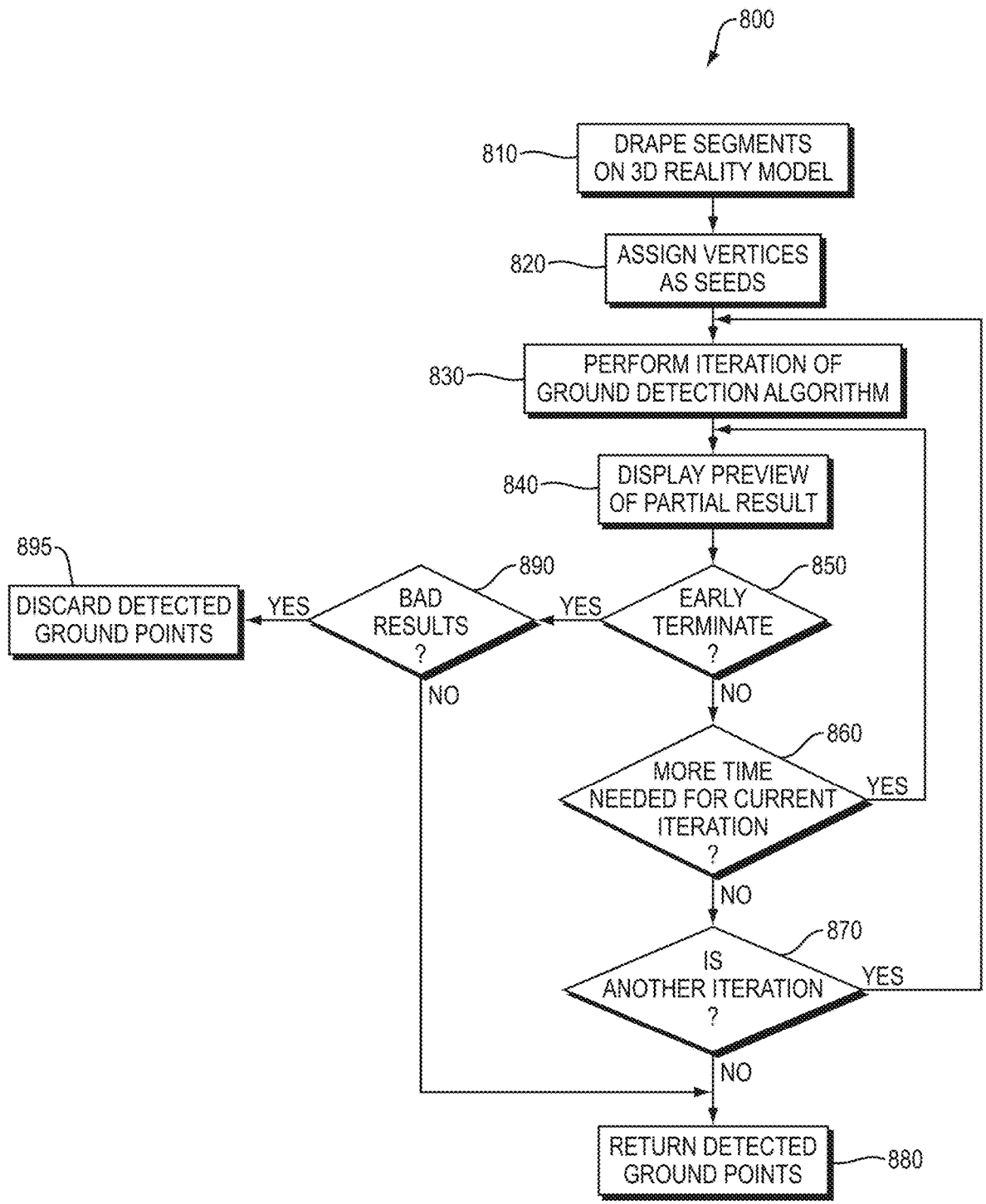
FIG. 8 is a flow diagram of an example expanded sequence of steps that may be implemented as part of FIG. 3 by a ground detection process to detect ground points within a design region.

Once the design region has been determined, the ground detection process may detect ground points within the region. FIG. 8 is a flow diagram of an example expanded sequence of steps 800 that may be implemented as part of step 320 of FIG. 3 by the ground detection process to detect ground points within the design region. In this example, use of an iterative ground detection algorithm is assumed. At step 810, the ground detection process drapes the segments of the polygon from FIG. 7 vertically on the 3-D reality model. At step 820, the ground detection process assigns the vertices of the draped segments as seeds for the ground detection algorithm. At step 830, the ground detection process performs an iteration of the ground detection algorithm. At step 840, a preview of partial results from the iteration is added to a display in the GUI (e.g., by showing a portion of the 3-D reality model as an opaque mesh of a uniform predetermined color, or with other visual indication). Since each iteration may take an extended period of time, the display of partial results may be updated several times during an iteration. To that end, at step 860, the ground detection process determines whether more than a given length of time (e.g., 10-20 seconds) is needed to continue the current iteration. If so, execution loops back to step 840 where partial results are again displayed. If not execution proceeds to step 870, where the ground detection process determines if another iteration is required. If another iteration is required (i.e. the ground detection is not complete), execution loops back to step 830. Otherwise, execution proceeds to step 880, where the ground detection process returns detected ground points.

The user may elect to terminate the ground detection process early if the partial results appear sufficient, or, alternatively, if they reveal a problem that may require a change of parameters used by the ground detection algorithm or a check of seed points. For example, referring back to FIG. 5, the user may observe that currently detected ground (here, indicated by a uniform opaque mesh) is not hiding (i.e. above) non-terrain features (e.g., trees), which indicates the ground detection process is performing well. Alternatively, if the user were to observe currently detected ground hiding non-terrain features, it may indicate that the parameters used by the ground detection algorithm were not correctly specified or bad seed points were used.

If the partial results appear sufficient or are too bad to warrant proceeding, the user may supply input, which is received at step 850, requesting that the ground detection process early terminate. At step 890, it is determined based on further user input, whether the early termination was due to bad results. If not due to bad results, and it was simply that the partial results appear sufficient, execution proceeds to step 880, where the ground detection process returns detected ground points of the partial results. If early termination was due to bad results, execution proceeds to step 895, where the ground detection process discards the ground points of the partial results and terminates.

Figure 9:
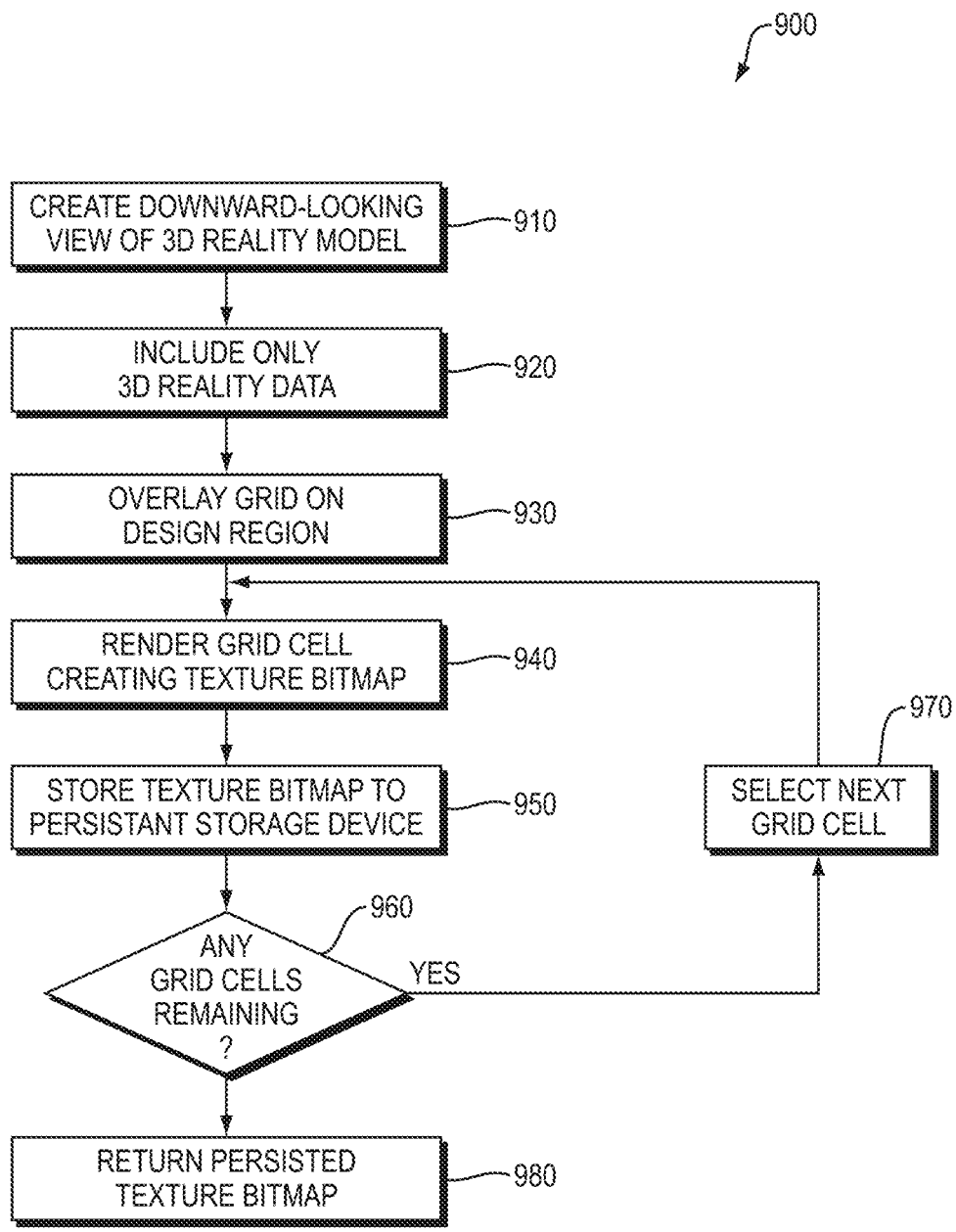
FIG. 9 is a flow diagram of an example expanded sequence of steps that may be implemented as part of FIG. 3 by a texture extraction process to extract textures from the 3-D reality model.

Once the ground detection has completed, a 2.5D terrain mesh may be directly generated. However, in some cases, it is beneficial to first to obtain textures for the design region from the 3-D reality model or from another data source (e.g., road map data) external to the original 3-D reality model, for use in texturing the 2.5D terrain mesh. Looking to the case where textures are extracted from the 3-D reality model, FIG. 9 is a flow diagram of an example expanded sequence of steps 900 that may be implemented as part of optional step 330 of FIG. 3 by the texture extraction process to extract textures from the 3-D reality model. At step 910, the texture extraction process creates a downward-looking view of the 3-D reality model. At step 920, the texture extraction process verifies only 3-D reality data is included in the downward looking view (e.g., CAD objects, annotations, text etc. that may have been previously added are excluded). At step 930, the texture extraction process overlays a grid on the design region. The grid may be sized slightly larger than the design region to avoid border texturing issues.

Figure 10:
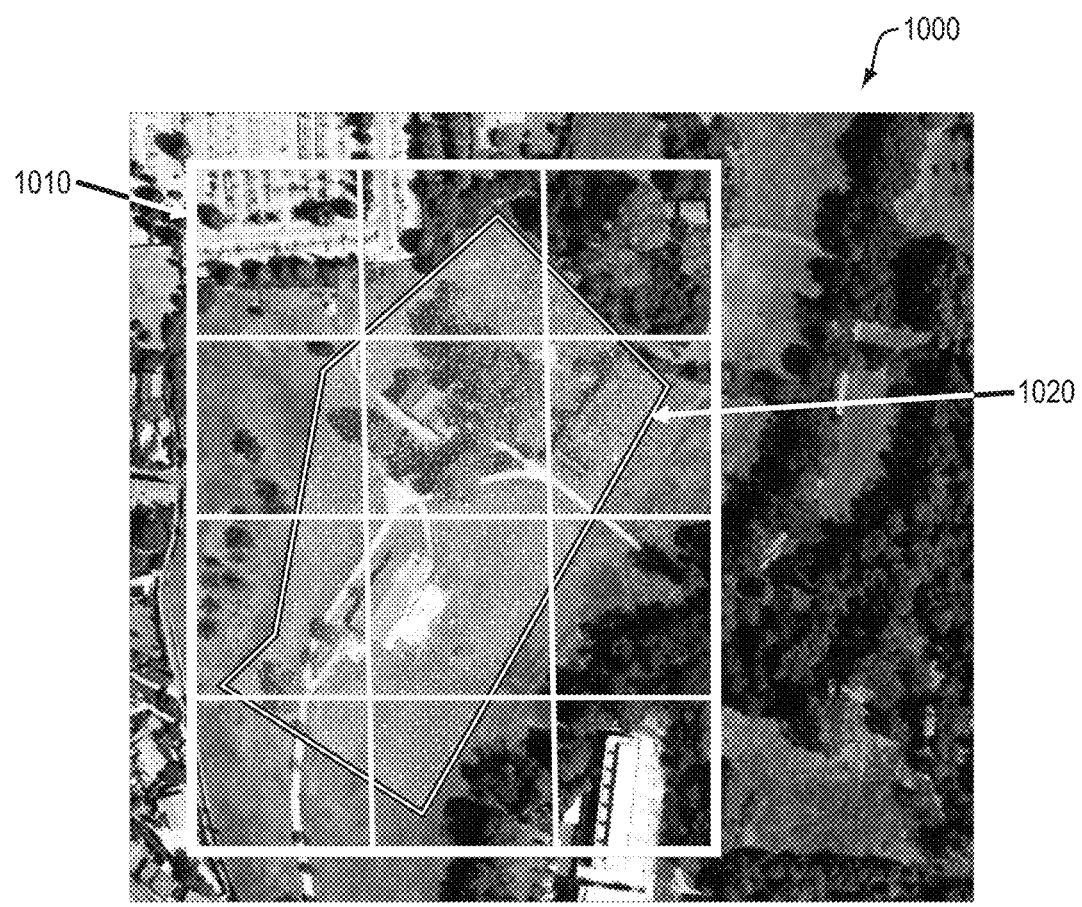
FIG. 10 is a downward-looking view of an example 3-D reality model showing a grid overlaid on a design region.

FIG. 10 is a downward-looking view 1000 of an example 3-D reality model showing a grid 1010 overlaid on the design region 1020. The size of the grid cells may depend on the resolution of the texture to be extracted (e.g., the pixel size) and the size of the design area, to provide that the texture within a given grid may be extracted without exceeding the resources of the electronic device 110 (e.g., available system memory 130 and/or graphics memory 155). The resolution of the texture to be extracted may be determined based on an existing texture atlas for the 3-D reality model.

An initial grid cell is selected, and, at step 940, the texture extraction process renders a grid cell creating a texture bitmap. At step 950, the rendered texture bitmap is stored to a persistent storage device 175 (e.g., a hard disk drive). The bitmap may be persisted as a single image file or as part of a global image file for the whole grid. The image file may be georeferenced to assist in eventual use of the texture bitmap to texture a 2.5D terrain mesh.

At step 960, the texture extraction process determines if there are any grid cells remaining. If so, at step 970, a next grid cell is selected, and execution loops back to step 940. If not, execution proceeds to step 980, where the persisted texture bitmap (from the separate image files or the global image file) is returned.

Figure 11:
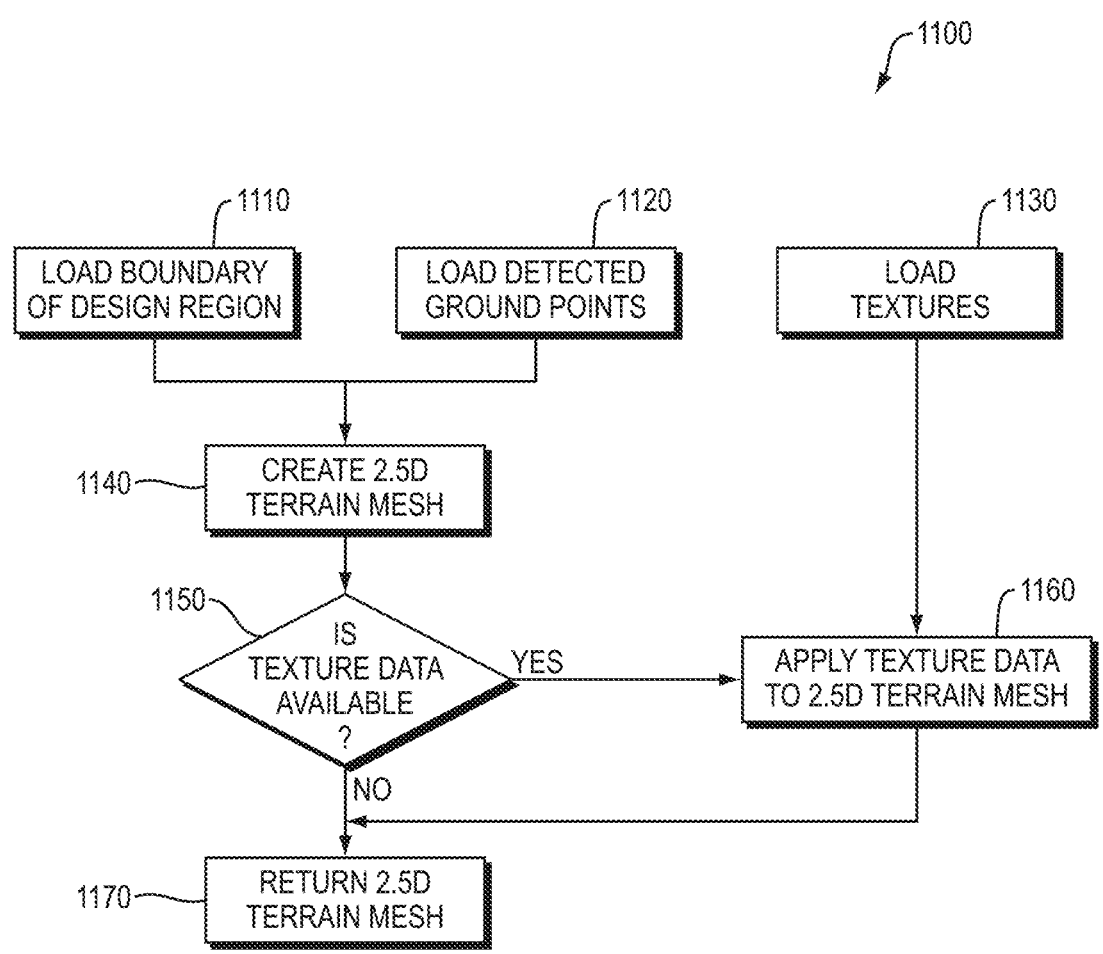
FIG. 11 is a flow diagram of an example expanded sequence of steps that may be implemented as part of FIG. 3 by a terrain creation process to generate a 2.5D terrain mesh (e.g., a 2.5D multi-resolution terrain mesh) for a design region.

A 2.5D terrain mesh may be generated for the design region. While a single resolution terrain mesh may be adequate for small design regions, for larger design regions a multi-resolution terrain mesh may be desirable. FIG. 11 is a flow diagram of an example expanded sequence of steps 1100 that may be implemented as part of step 340 of FIG. 3 by the terrain creation process to generate a 2.5D terrain mesh (e.g., a 2.5D multi-resolution terrain mesh) for the design region. At step 1110, the terrain creation process loads the boundary of the design region (e.g., draped segments) and at step 1120 loads detected ground points. If texture data is available (e.g., a texture bitmap is available) for the design region, at step 1130, the texture data is loaded. At step 1140, the terrain creation process applies a terrain generation algorithm to create a 2.5D terrain mesh (e.g. a 2.5D multi-resolution terrain mesh). At step 1150, the terrain creation process determines whether texture data is available. If so, execution proceeds to step 1160, where the terrain creation process applies the texture data (e.g., the texture bitmap) to the generated 2.5D terrain mesh. Then, at step 1170, the terrain creation process returns a completed (now possibly textured) 2.5D terrain mesh for the design region.

Figure 12:
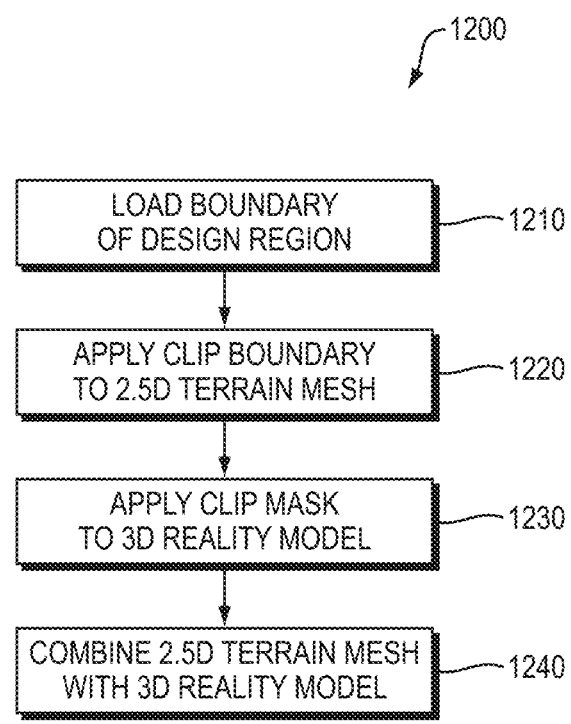
FIG. 12 is a flow diagram of an example expanded sequence of steps that may be implemented as part of FIG. 3 by a clipping process to clip around a design region.
Figure 13A:
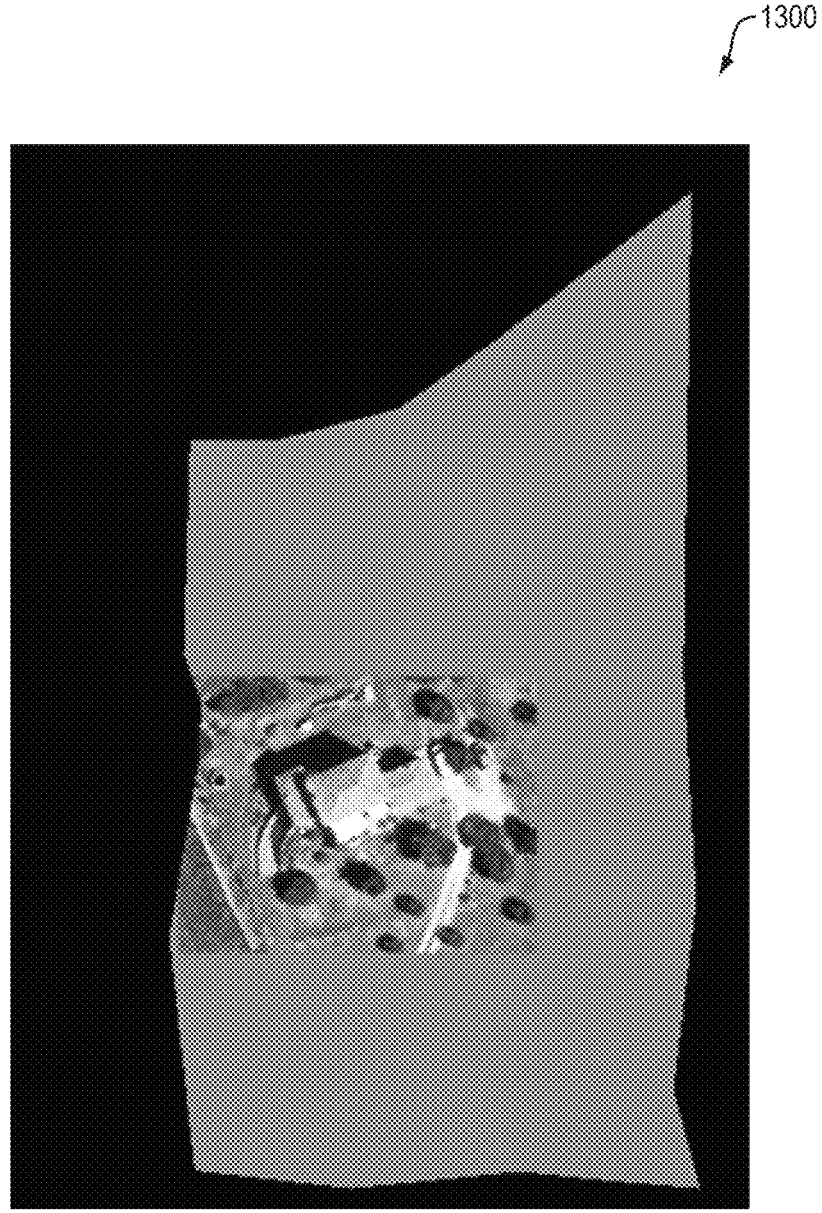
FIG. 13A is a downward-looking view of an example 2.5D terrain mesh that is larger than a design region.
Figure 13B:
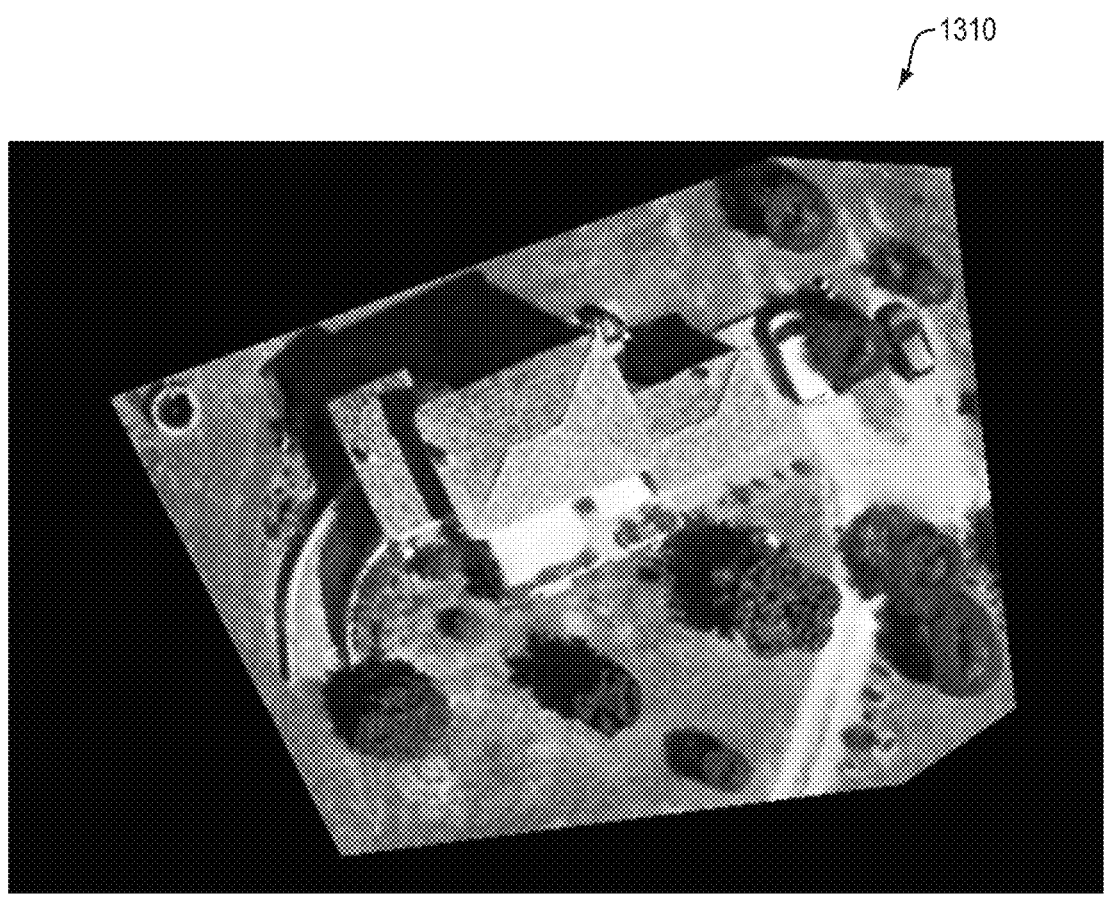
FIG. 13B is a downward-looking view of the example 2.5D terrain mesh from FIG. 13A, now clipped to the design region.
Figure 14:
FIG. 14 is a downward-looking view of an example 3-D reality model that has been clipped around the design region used in FIGS. 13A-13B.
Figure 15:
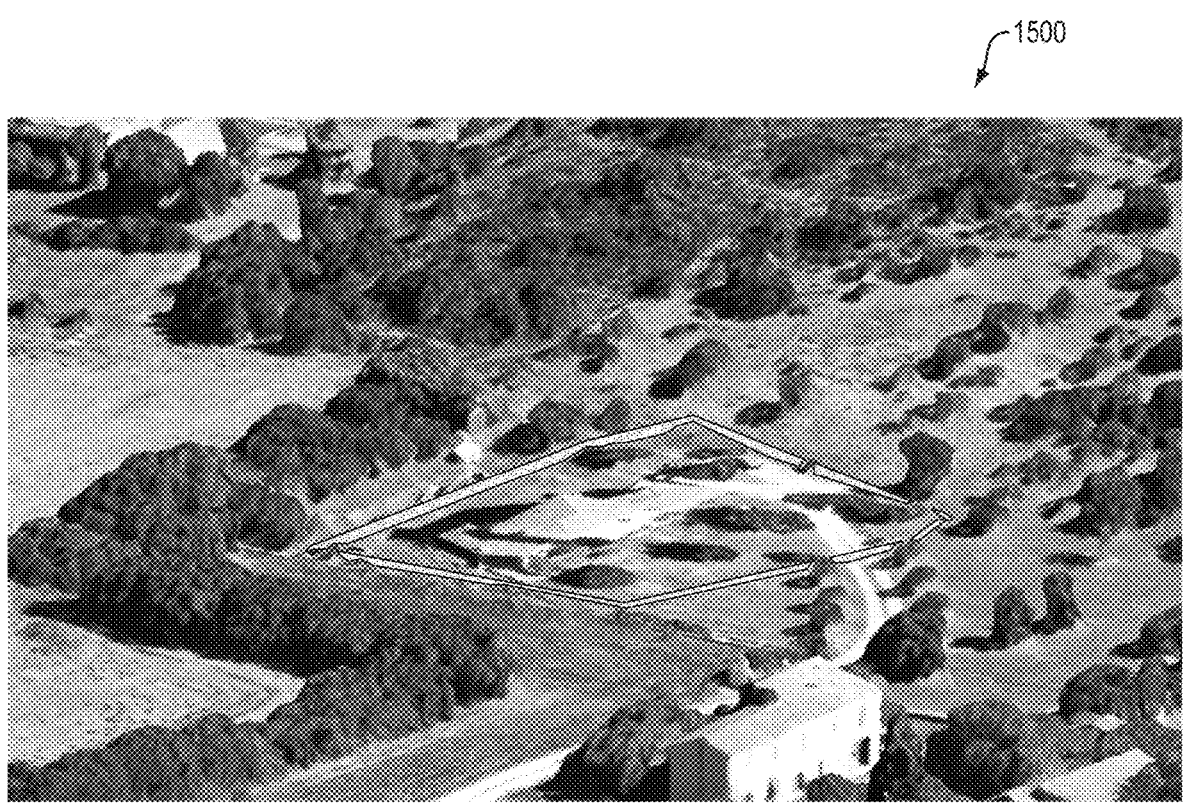
FIG. 15 is a view of an example 2.5D terrain mesh visible in a design region surrounded by a 3-D reality model which provides context, as may be shown in a GUI of design application.

After the 2.5D terrain mesh has been generated for the design region, it may be displayed in the design region. To ensure that the 3-D reality model will not hinder the visualization of the terrain mesh, the 3-D reality model is clipped around the design region (i.e. masked). FIG. 12 is a flow diagram of an example expanded sequence of steps 1200 that may be implemented as part of step 350 of FIG. 3 by a clipping process to clip around the design region. At step 1210, the clipping process loads the boundary of the design region. At step 1220, the clipping process applies a clip boundary coinciding with the design region to the 2.5D terrain mesh. Clipping of the 2.5D terrain mesh may be needed since the terrain creation process may generate a 2.5D terrain mesh that is larger than the design region. FIG. 13A is a downward-looking view 1300 of an example 2.5D terrain mesh that is larger than a design region. FIG. 13B is a downward-looking view 1310 of the example 2.5D terrain mesh from FIG. 13A, now clipped to the design region used in FIG. 13A. At step 1230, the clipping process applies a clip mask corresponding to the design region to the 3-D reality model. FIG. 14 is a downward-looking view 1400 of an example 3-D reality model that has been clipped around the design region used in FIGS. 13A-13B. In some implementations, all the clipping may be non-destructive clipping, as described in U.S. patent application Ser. No. 15/669,593, which is incorporated by reference above. At step 1240, the clipping process combines the clipped 2.5D terrain mesh and the clipped 3-D reality model, to produce a display in which the 2.5D terrain mesh is visible in the design region, and the remaining 3-D reality model provides context around the design region. FIG. 15 is a view 1500 of an example 2.5D terrain mesh visible in a design region surrounded by a 3-D reality model which provides context, as may be shown in a GUI of the design application 190.

Figure 16:
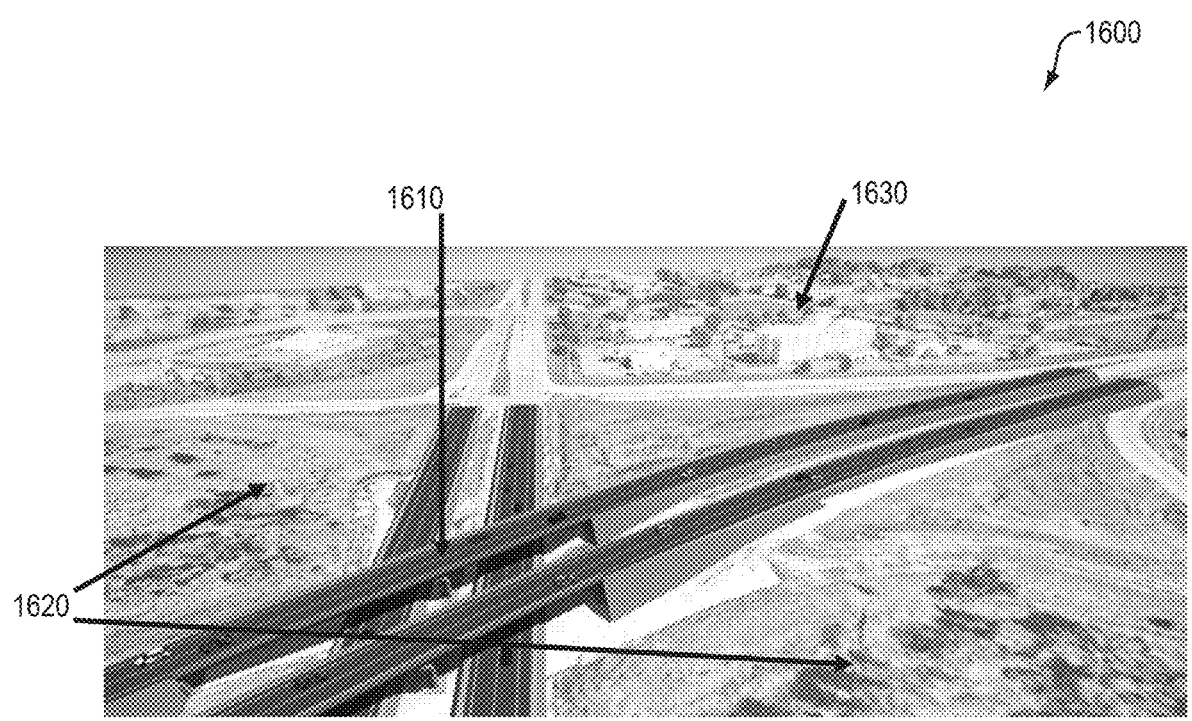
FIG. 16 is a view of an example new design (here a roadway) placed on the "base" defined by a 2.5D terrain mesh within a design region, among the larger context of a 3-D reality model.

After the combined 2.5D terrain mesh and 3-D model is displayed to a user, a CAD modeling process of design application 190 may enable the user to create a new design. For example, the user may place CAD objects for planned infrastructure from the library of CAD objects 194 on the 2.5D terrain mesh within the design to define a new design. FIG. 16 is a view 1600 of an example new design (here a road system) 1610 placed on the "base" defined by a 2.5D terrain mesh 1620 within a design region, among the larger context of a 3-D reality model 1630. With or without considering the added new design, the 2.5D terrain mesh may be used to compute quantities (e.g., volume) and perform analysis (e.g., drainage analysis), that may not be possible or practicable using 3-D reality data directly. The result of the computation or analysis may then be displayed in the GUI of the design application 190.

It should be understood that various adaptations and modifications may be readily made to what is described above, to suit various implementations and environments. While it is discussed above that many aspects of the techniques may be implemented by specific software processes (e.g., of an application stored in a non-transitory electronic device readable medium for execution on one or more processors) or on specific hardware devices, it should be understood that some or all of the techniques may also be implemented by different software on different hardware. In addition to general-purpose computers, the hardware may include specially configured logic circuits and/or other types of hardware components. Above all, it should be understood that the above descriptions are meant to be taken only by way of example.

What is claimed is:

1. A method for infrastructure design using three dimensional (3-D) reality data, comprising:
    determining, by an electronic device, a boundary of a design region in a three dimensional (3-D) reality model, the 3-D reality model to represent existing conditions at a site including ground and non-terrain features, wherein non-terrain features are features that are not substantially at ground level including man-made 3-D structures and natural 3-D structures, the boundary of the design region formed as a polygon that extends over at least representations of the ground;
    detecting, by a ground detection process executing on the electronic device or another electronic device, a plurality of ground points of the 3-D reality model for ground within the design region;
    based at least on the boundary of the design region and the detected ground points of the 3-D reality model, generating a two-and-a-half (2.5D) terrain mesh that represents ground within the design region, the generating the 2.5D terrain mesh to flatten any non-terrain features within the design region;
    clipping around the design region, the clipping to apply a clip mask to the 3-D reality model to show the 2.5D terrain mesh that represents ground within the design region and a remaining part of the 3-D reality model that represents ground and non-terrain features external to the design region;
    placing one or more 3-D computer aided design (CAD) objects that represent planned infrastructure upon the 2.5D terrain mesh that represents ground within the design region; and
    displaying, in the GUI shown by the electronic device, a combined view including the 3-D CAD objects that represent planned infrastructure placed upon the 2.5D terrain mesh that represents ground within the design region, and the 2.5D terrain mesh that represents ground within the design region surrounded by the remaining part of the 3-D reality model that represents ground and non-terrain features external to the design region.

2. The method of claim 1, further comprising:
    obtaining textures for the design region from the 3-D reality model or another data source; and
    applying the textures to the 2.5D terrain mesh.

3. The method of claim 2, wherein the obtaining textures further comprises:
    creating a series of texture bitmaps for grid cells of the design region.

4. The method of claim 1, wherein the determining comprises receiving, in a graphical user interface (GUI) shown by the electronic device, user input specifying the boundary of the design region, wherein the user input specifying the boundary of the design region comprises a drawing of the polygon on a view of the 3-D reality model shown in the GUI.

5. The method of claim 4, wherein the user input indicates portions of the boundary also extend over non-terrain features.

6. The method of claim 1, wherein the ground detection process utilizes an iterative ground detection algorithm, and the method further comprises:
    displaying in the GUI a preview of partial results while the ground detection process is executing;
    receiving, in the GUI shown by an electronic device, user input requesting that the ground detection process early terminate; and
    in response to the user input requesting that the ground detection process early terminate, either returning detected ground points of the 3-D reality model of the partial results or discarding the ground points of the 3-D reality model of the partial results.

7. The method of claim 1, wherein the 2.5D terrain mesh is a 2.5D multi-resolution terrain mesh, and the generating generates a plurality of levels of detail (LOD).

8. The method of claim 1, wherein the clipping further comprises:
    applying a clip boundary coinciding with the design region to the 2.5D terrain mesh.

9. An electronic device comprising:
    a display screen;
    a processor; and
    a memory coupled to the processor and configured to store a three dimensional (3-D) reality model, the 3-D reality model to represent existing conditions including ground and non-terrain features existing structure, at a site and a library of computer aided design (CAD) objects, and instructions for a design application executable on the processor, the design application having a plurality of software processes including:
        a design region definition process configured to determine a boundary of a design region of the 3-D reality model, the boundary of the design region formed as a polygon that extends over at least representations of ground,
        a ground detection process configured to detect a plurality of ground points of the 3-D reality model for ground within the design region,
        a terrain creation process configured to generate a two-and-a-half (2.5D) terrain mesh that represents ground within the design region, based at least on the user-specific boundary of the design region and the detected ground points of the 3-D reality model, the terrain creation process to flatten any non-terrain features within the design region,
        a clipping process configured to apply a clip mask to the 3-D reality model to show the 2.5D terrain mesh that represents ground within the design region and a remaining part of the 3-D reality model that represents ground and non-terrain features external to the design region, and
        a CAD modeling process configured to place one or more 3-D computer aided design (CAD) objects that represent planned infrastructure upon the 2.5D terrain mesh that represents ground within the design region, and display in a graphical user interface (GUI) on the display screen a combined view including the 3-D CAD objects that represent planned infrastructure placed upon the 2.5D terrain mesh that represents ground within the design region, and the 2.5D terrain mesh that represents ground within the design region surrounded by the remaining part of the 3-D reality model that represents ground and non-terrain features external to the design region, wherein non-terrain features are features that are not substantially at ground level including man-made 3-D structures and natural 3-D structures.

10. The electronic device of claim 9, wherein the software processes further include:
a process configured to obtain textures from the design region from the 3-D reality model or another data source,
wherein the terrain creation process is further configured to apply the textures to the 2.5D terrain mesh.

11. The electronic device of claim 10, wherein the process is further configured to create a series of texture bitmaps for grid cells of the design region.

12. The electronic device of claim 9, wherein the design region definition process is further configured to receive user input that specifies the boundary of the design region, wherein the user input specifying the boundary of the design region comprises drawing of the polygon on a view of the 3-D reality model shown in the GUI.

13. The electronic device of claim 9, wherein the design region definition process is further configured to receive user input that specifies the boundary of the design region, wherein the user input indicates portions of the boundary also extend over non-terrain features.

14. The electronic device of claim 9, wherein the ground detection process utilizes an iterative ground detection algorithm, and is further configured to display in the GUI a preview of partial results while the ground detection process is executing, receive user input requesting that the ground detection process early terminate, and in response to the user input requesting that the ground detection process early terminate, either return detected ground points of the 3-D reality model of the partial results or discard the ground points of the 3-D reality model of the partial results.

15. The electronic device of claim 9, wherein the 2.5D terrain mesh is a 2.5D multi-resolution terrain mesh.

16. The electronic device of claim 9, wherein the clipping process is further configured to apply a clip boundary coinciding with the design region to the 2.5D terrain mesh.

17. A method for infrastructure design using three dimensional (3-D) reality data, comprising:
determining a design region of a three dimensional (3-D) reality model, the 3-D reality model to represent existing conditions including ground and non-terrain features at a site, wherein non-terrain features are features that are not substantially at ground level including man-made 3-D structures and natural 3-D structures;
reducing the design region to be a two-and-a-half (2.5D) terrain mesh that represents ground, the reducing to flatten any non-terrain features that may be within the design region;
apply a clip mask to the 3-D reality model to show the 2.5D terrain mesh that represents ground within the design region and a remaining part of the 3-D reality model that represents ground and non-terrain features external to the design region;
placing one or more 3-D computer aided design (CAD) objects that represent planned infrastructure upon the 2.5D terrain mesh that represents ground within the design region; and
displaying, in a graphical user interface (GUI) shown by the electronic device, a combined view including the 3-D CAD objects that represent planned infrastructure placed upon the 2.5D terrain mesh that represents ground within the design region, and the 2.5D terrain mesh that represents ground within the design region in turn surrounded by the remaining part of the 3-D reality model that represents ground and non-terrain features existing structures external to the design region.

18. The method of claim 17, further comprising:
obtaining textures for the design region from the 3-D reality model; and
applying the textures to the 2.5D terrain mesh.

19. The method of claim 17, wherein the 2.5D terrain mesh is a 2.5D multi-resolution terrain mesh, and the reducing generates a plurality of levels of detail (LOD).

20. The method of claim 17, wherein the clipping further comprises:
applying a clip boundary coinciding with the design region to the 2.5D terrain mesh.

* * * * *

UNITED STATES PATENT AND TRADEMARK OFFICE
CERTIFICATE OF CORRECTION

| | | |
|---|---|---|
| PATENT NO. | : 11,164,392 B2 | Page 1 of 1 |
| APPLICATION NO. | : 15/699266 | |
| DATED | : November 2, 2021 | |
| INVENTOR(S) | : Elenie Godzaridis et al. | |

It is certified that error appears in the above-identified patent and that said Letters Patent is hereby corrected as shown below:

In the Claims

Claim 9:
Column 10, Lines 31-32 read:
"ground and non-terrain features existing structure, at a
site and a library of computer aided design (CAD)"
Should read:
-- ground and non-terrain features at a
site, and a library of computer aided design (CAD) --

Claim 17:
Column 12, Line 29 reads:
"existing structures external to the design region"
Should read:
-- external to the design region --

Signed and Sealed this
Twelfth Day of August, 2025

Coke Morgan Stewart
*Acting Director of the United States Patent and Trademark Office*